(12) United States Patent
Nakatsuka et al.

(10) Patent No.: US 6,280,828 B1
(45) Date of Patent: Aug. 28, 2001

(54) FLEXIBLE WIRING BOARD

(75) Inventors: Yasuo Nakatsuka; Yuichi Takayoshi; Chiharu Miyaake; Toshihiko Sugimoto, all of Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 09/526,491

(22) Filed: Mar. 15, 2000

(30) Foreign Application Priority Data

Apr. 27, 1999 (JP) .................................................. 11-119544

(51) Int. Cl.$^7$ ........................................................ B32B 3/00
(52) U.S. Cl. ............................ 428/209; 174/254; 174/257
(58) Field of Search ............................ 428/209; 174/254, 174/257

(56) References Cited

U.S. PATENT DOCUMENTS

| | | | | |
|---|---|---|---|---|
| 5,372,871 | * | 12/1994 | Takase et al. .......................... | 428/209 |
| 5,621,333 | * | 4/1997 | Long et al. ............................. | 324/762 |
| 5,864,470 | * | 1/1999 | Shim et al. ............................. | 361/777 |

FOREIGN PATENT DOCUMENTS

| | | |
|---|---|---|
| 58-79249 | 5/1983 | (JP) . |
| 5-55222 | 3/1993 | (JP) . |
| 6-48236 B2 | 6/1994 | (JP) . |
| 6-101489 B2 | 12/1994 | (JP) . |
| 7-104245 B2 | 11/1995 | (JP) . |
| 7-120686 B2 | 12/1995 | (JP) . |

OTHER PUBLICATIONS

Wire bondability for Copper polyimide substrate, T. Nakazawa et al., 5th Microelectronics Symposium pp. 163–166, Jun. 1993.

Electroless Gold Plating for Semiconductor Package Substrate, Kiyoshi Hasegawa et al., Hitachi Chemical's Technical Report No. 31, pp. 21–24 (1998–7).

Influence of Electroless Gold Plating Thickness on Wire Bondability and Ball Solderability on Tape Substrate for BGA Packages, Akira Chinda et al., Surface Finishing vol. 49, No. 12, pp.49–55, 1998.

Polyimide Film Using Interposer for CSP (Chip Size/Scale Package), Fumio Inoue et al., Hitachi Chemical's Technical Report No. 31, pp. 17–20 (1998–7).

Influence of FPC Electrode Surface Treatment on Performance of Wire bonding (6th Academic Lecture of Printed Circuit Academic Conference pp. 135–136).

Wire–bonding on Printed Circuit Boards (Circuit World vol. 20, No. 2, pp. 8–13, 1994).

* cited by examiner

*Primary Examiner*—Cathy Lam
(74) *Attorney, Agent, or Firm*—Kubovcik & Kubovcik

(57) ABSTRACT

A flexible wiring board including a gold pad having dynamic Vickers hardness of not less than 50 or having a ratio of amount of nickel in a surface of the gold pad (atomic weight %) to thickness of gold ($\mu$m) of not more than 5 or having both the dynamic Vickers hardness of not less than 50 and the ratio of amount of nickel in the surface of the gold pad (atomic weight %) to thickness of gold ($\mu$m) of not more than 5, to provide a flexible wiring board that can substantially ensure the connection reliability when the board is connected with a semiconductor device by wiring bonding.

7 Claims, 3 Drawing Sheets

FLEXIBLE WIRING BOARD

BACKGROUND OF THE INVENTION

1. Technical Field of the Invention

The present invention relates to a flexible wiring board and, more particularly, to a flexible wiring board on which a semiconductor device is placed or is to be placed.

2. Description of the Prior Art

Flexible wiring boards, excellent in flexibility and flexuosity, are in wide use mainly for the wiring of a movable member in the field of electrical equipment and electronic equipment. On the other hand, rigid printed circuit boards (rigid wiring boards) have been used hitherto as wiring boards on which semiconductor devices are placed or are to be placed, while flexible wiring boards on which semiconductor devices are placed or are to be placed have also come into use in recent years.

These flexible wiring boards are in general produced by the following processes. A conductor layer made of conductor, such as copper, is laminated on a base layer of insulating material, such as polyimide, through an adhesive layer if necessary, and then a specific circuit pattern is produced on the conductor layer by a subtractive process and the like. Thereafter, a cover layer of insulating material such as polyimide is further laid over it through an adhesive layer if necessary. In the area of these flexible wiring boards where a semiconductor device is placed or is to be placed, the base layer is provided, on its back surface, with a reinforcing layer for bearing pressure during a wire bonding, and also the cover layer is provided with gold pads for the bonding of the semiconductor devices by the wire bonding.

The gold pads are arranged in position corresponding to terminals of the semiconductor devices. The gold pads are each formed by etching part of the cover layer to expose the conductor layer; nickel-plating the exposed conductor layer to form a surface coating thereon; and then plating the surface coating with gold.

In recent years, with rapid advances in performance and reduction in size, profile and weight of electrical equipment and electronic equipment, it comes to be essential for the flexible wiring board, on which the semiconductor devices are placed or are to be placed, to ensure the reliability of connection with the semiconductor devices placed on board.

It is the object of the present invention to provide a flexible wiring board that can substantially ensure the connection reliability when the board is connected with the semiconductor devices placed on board by the wiring bonding.

SUMMARY OF THE INVENTION

The present invention provides a flexible wiring board including a gold pad having dynamic Vickers hardness of not less than 50. Also, the present invention provides a flexible wiring board including a gold pad having a ratio of amount of nickel in a surface of the gold pad (atomic weight %) to thickness of gold ($\mu$m) of not more than 5. Further, the present invention provides a flexible wiring board including a gold pad having dynamic Vickers hardness of not less than 50 and a ratio of amount of nickel in a surface of the gold pad (atomic weight %) to thickness of gold ($\mu$m) of not more than 5.

These flexible wiring boards according to the present invention show such high connection reliability by the wire bonding that the reliable connection can be achieved. Thus, the flexible wiring boards of the present invention can minimize the yielding of defective products and also can be used as the electronic components of high reliability.

DESCRIPTION OF THE PREFERRED EMBODIMENT

Figure 1:
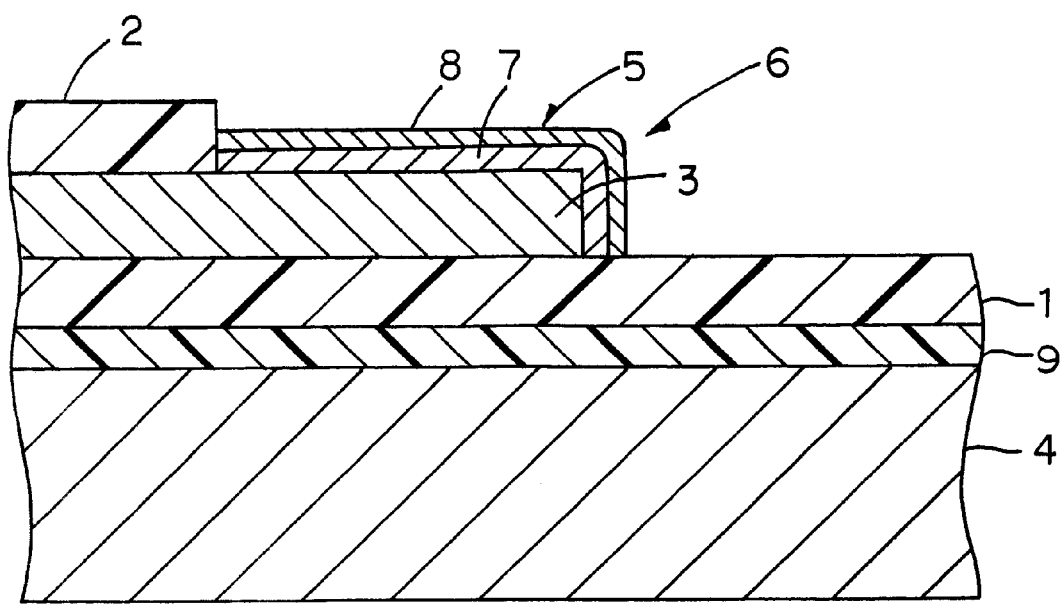
FIG. 1 is a sectional view of a part of a flexible wiring board having a gold pad of one embodiment of the present invention.

A flexible wiring board of the present invention is produced by the following processes, for example. A base layer of insulating material is formed and then a specific circuit pattern of a conductor is produced on the base layer and thereafter is covered with a cover layer of insulating material.

No particular limitations are imposed on the insulating materials used for forming the base layer and the cover layer, in so far as they can be used as the insulator of the flexible wiring board. The insulating materials which may be used include plastics, for example, polyimide, polyether nitrile, polyether sulfone, polyethylene terephthalate, polyethylene naphthalate, and polyvinyl chloride. In terms of heat resistance, dimensional resistance, electric properties, mechanical properties, chemical resistance and costs, polyethylene terephthalate, polyethylene naphthalate and polyimide are of preferable, and polyimide is of further preferable.

No particular limitations are imposed on the conductor materials used for forming the circuit pattern, in so far as they can be used as the conductor of the flexible wiring board. The conductor materials which may be used include, for example, copper, nickel, gold, solder and alloys thereof. Copper is of preferable among them.

The flexible wiring board is produced by the following processes. A base layer of an insulating material is formed and then a conductor layer is laminated on the base layer, through an adhesive layer and the like if necessary, by a known method. Then, the conductor layer is patterned by a known process such as a printing process, an additive process or a subtractive process, to form a circuit pattern thereon and thereafter is covered with a base layer of insulating material, through the adhesive layer and the like if necessary, by a known process.

No particular limitations are imposed on the adhesives used for forming the adhesive layer, in so far as they can be used for laminating the conductor layer and cover layer of the flexible wiring board. The adhesives which may be used include thermosetting adhesives, such as epoxy-nitrile-butyl rubber adhesive, epoxy-acrylic rubber adhesive, butyral adhesive and polyurethane adhesive; and thermoplastic adhesives such as synthetic rubber adhesive; and pressure-sensitive adhesives such as acrylic adhesive. Preferable among them are thermosetting adhesives, or further preferable are epoxy-nitrile-butyl rubber adhesive and epoxy-acrylic rubber adhesive, in terms of bonding strength, heat resistance, moisture heat resistance, working property and durability.

As an example of how the base layer and/or the cover layer and the conductor layer are laminated without intervening any adhesive layers therebetween can be recited the process in which a thin layer of monomeric solution such as polyamide acid solution is coated on the conductor layer and, then, is dried and cured to form the base layer and/or the cover layer.

The base layer and the cover layer thus laminated have a thickness of usually about 0.01 to about 0.3 mm, preferably, about 0.025 to about 0.125 mm, and the conductive layer has a thickness of usually about 1 to about 50 $\mu$m, preferably about 2 to about 35 $\mu$m. Further, the adhesive layer has a thickness of usually about 0.003 to about 0.2 mm, or preferably, about 0.005 to about 0.05 mm.

Semiconductor devices are placed on the flexible wiring board thus produced. In the area of the flexible wiring board where the semiconductor devices are placed or are to be placed, the base layer is provided, on its back surface, with a reinforcing layer to bear the pressure applied during the wire bonding, and also the cover layer is provided with the gold pads to be connected with the semiconductor devices by the wire bondings.

The reinforcing layer is formed by forming a metal such as stainless steel or aluminum; a ceramic; a composite material such as glass-epoxy resin; or plastics such as polyimide into a sheet form and then laminating it on the back surface of the base layer through the adhesive layer. The reinforcing layer thus laminated has a thickness of usually about 0.2 to about 1 mm. The adhesive layer has a thickness of usually about 10 to about 50 $\mu$m. The adhesives used therefor include the same adhesives as those listed above. Epoxy-nitrile-butyl rubber adhesive and epoxy-acrylic rubber adhesive are of preferable.

The gold pads are arranged corresponding in position to the terminals of the semiconductor devices. The gold pads are formed by, for example, opening parts of the cover layer by a known process, such as an etching, to expose the conductor layers then nickel-plating the exposed parts to form a surface coating thereon and then plating the surface coating with gold. The nickel plating and the gold plating can be carried out by a known plating such as an electroplating or an electroless plating.

Referring to FIG. 1, there is shown a sectional view of an example of the flexible wiring board at a gold pad providing part thereof. In FIG. 1, the conductor layer 3 forming a specific circuit pattern thereon is interposed between the base layer 1 and the cover layer 2. The reinforcing layer 4 is provided on the back surface of the base layer 1 through the adhesive layer 9. The cover layer 2 and the gold pad 5 are insert therefor. The gold pad 5 includes a nickel plating layer 7 formed as a surface coating in an opening 6 of the cover layer 2 and a gold plating layer 8 formed on the nickel plating layer 7. It is noted that the adhesive layers which may be interposed between the base layer 1 and the conductor layer 3 and between the conductor layer 3 and the cover layer 2, if necessary, are omitted from FIG. 1.

According to the present invention, the gold pad is formed to have dynamic Vickers hardness of not less than 50, preferably 50–200, or further preferably 50–150. It is added for reference purpose that the gold pad of flexible wiring board of a conventional type has dynamic Vickers hardness of the order of 25–40.

The Vickers hardness is a measure of the hardness of a material, calculated from the size of an impression produced by a quadrilateral pyramid-shaped Vickers indenter being pressed into a test sample under a prescribed test load. The Vickers hardness is usually expressed as a value obtained by dividing the applied test load by the surface area of the impression which is calculated from a diagonal length of an impression produced after the Vickers indenter is pressed into the test sample.

However, the dynamic Vickers hardness referred to in the present invention is expressed as a value obtained by dividing the applied test load by a contact area of the Vickers indenter which is calculated from a depth of an impression produced by the Vickers indenter being pressed into the test sample. The depth is measured with the Vickers indenter pressed into the test sample. More specifically, for example, the dynamic Vickers hardness DHv can be determined by the following expression (1) from the depth h ($\mu$m) of an impression produced by a quadrilateral pyramid-shaped diamond Vickers indenter having a polyhedral angle of 136° used as the Vickers indenter being pressed into a test sample under a test load P (mN).

$$DHv=3.858P/h^2 \quad (1)$$

(DHv: Dynamic Vickers hardness, P: Test load (mN), and h: Impression depth ($\mu$m)).

With the common Vickers hardness, since the impression depth is calculated from the impression produced after the Vickers indenter is pressed into the test sample, only the plastic deformation is measured, and the elastic deformation presented when the Vickers indenter is removed from the test sample is not measured. In contrast to this, with the dynamic Vickers hardness, since the impression depth is calculated in a state that the Vickers indenter is being pressed into the test sample, both the plastic deformation and the elastic deformation are measured. Thus, with the dynamic Vickers hardness, the deformation of the gold pad at wire bonding can be expressed more precisely.

This dynamic Vickers hardness can be measured with a known hardness test equipment by, for example, applying a prescribed load to the Vickers indenter contacted with a surface of the gold pad to measure the displacement of the Vickers indenter from the surface of the gold pad. The test load of 50 gf is usually used.

Also, in the present invention, the dynamic Vickers hardness of the gold pad is the hardness measured at temperature at which the wire is connected with the gold pad by the wire bonding. The measurement is usually made at a room temperature. For example, in the case where the flexible wiring board is provided with a heater to heat the flexible wiring board so that the wire bonding can be performed at a temperature higher than room temperature, then the gold pad is required to have the dynamic Vickers hardness of not less than 50 at the higher temperature. The measurement of the dynamic Vickers hardness at such a higher temperature than room temperature may be made by, for example, setting atmospheric temperature around a measuring part of the harness test equipment at such a higher temperature.

To allow the gold pad to have the dynamic Vickers hardness of not less than 50, a proper design can be adopted by adequately selecting the material and thickness of the respective layers (reinforcing layer, adhesive layer, base layer, additional adhesive layer if necessary, conductor layer, nickel plating layer and gold plating layer) in the thickness direction of the flexible wiring board at a part thereof at which the gold pad is provided.

To be more specific, the design should preferably be made in consideration of the following factors.

For example, the nickel plating layer is made to have an increased thickness. The preferable thickness is 4–15 $\mu$m and further preferable is 5–12 $\mu$m. Also, the base layer and the conductor layer are laminated with each other without interposing any adhesive layer therebetween. In addition, the adhesives having complex shear modulus (G*) of not less than $2.0 \times 10^9$ dyn/cm$^2$ at 25 Hz are used for the adhesive layer between the reinforcing layer and the base layer and the adhesive layer between the base layer and the conductor layer. Also, the conductor having high hardness is used. For example, electrolytic copper foil of microscopic crystals may be used as the conductor. The conductor of increased thickness is used. The base layer that shows high elasticity in the wire bonding and has small thickness is formed. The reinforcing layer that shows high elasticity in the wire bonding and has large thickness is formed.

Of these factors, the thickness of the nickel plating layer and the complex shear modulus of the adhesive should preferably be considered in particular.

Also, in the present invention, a ratio of amount of nickel (atomic weight %) in a surface of the gold pad to thickness of gold ($\mu$m) may be not more than 5, preferably, not more than 4.

The flexible wiring board is given heat histories under various conditions in the processes after the process of forming the gold pad. When the flexible wiring board is given such heat histories, the nickel of the nickel plating layer may sometimes be diffused and deposited on the surface of gold through a grain boundary or a void of gold in the gold plating layer to form oxide or hydroxide of nickel on the surface of gold, and as such may sometimes hinder connection reliability in the wire bonding. Such tendency is evidently presented particularly when the gold plating layer is thin. For this reason, according to the present invention, in terms of both aspects of the amount of nickel in the surface of the gold pad and the thickness of gold, the ratio of amount of nickel (atomic weight %) in the surface of the gold pad to thickness of gold ($\mu$m) is set to be not more than 5 so that the condition for good connection reliability in the wire bonding to be ensured can be determined.

The amount of nickel (atomic weight %) in the surface of the gold pad can be measured with an X-ray photoelectron spectroscopy (ESCA), and the thickness of gold or the thickness of the gold plating layer can be measured with a fluorescent X-ray coating thickness measuring instrument.

Thus, in order to set the ratio of amount of nickel (atomic weight %) in the surface of the gold pad to thickness of gold ($\mu$m) to be not more than 5, the thickness of the gold plating layer is preferably increased. To be more specific, the thickness of the gold plating layer is preferably set to be 0.3–5 $\mu$m, further preferably 0.5–2 $\mu$m, for example. Also, the amount of nickel (atomic weight %) in the surface of the gold pad is preferably reduced. To be more specific, the amount of nickel (atomic weight %) in the surface of the gold pad is preferably set to be not more than 0.5 atomic weight %, for example. As an example of how the amount of nickel (atomic weight %) in the surface of the gold pad is reduced can be recited the process in which the nickel plating layer and the gold plating layer are formed by the electroplating process and the process in which the surface of the gold pad is washed.

For example, a wet washing process and a dry washing process can be recited as the process of washing the surface of the gold pad. The wet washing process includes, for example, the process in which the surface of the gold pad is washed by acid solution such as hydrochloric acid or sulfuric acid. To be more specific, a sulfuric acid washing in which an ultrasonic cleaning is made for three minutes using 5% dilute sulfuric acid and thereafter the ultrasonic cleaning is made for three minutes using demineralized water can be recited as an example. Also, the dry washing process includes, for example, the process in which the surface of the gold pad is washed by a plasma washing process using argon gas. To be more specific, an argon-plasma washing in which a plasma treatment is made under the conditions of, for example, high frequency output of 450W and gas pressure of 200 mTorr for five minutes can be recited as an example. The nickel oxide and the nickel hydroxide in the surface of gold can be removed by washing the surface of the gold pad.

The flexible wiring board thus formed to have either the gold pad having the dynamic Vickers hardness of not less than 50 or the gold pad having the ratio of amount of nickel (atomic weight %) in a surface of the gold pad to thickness of gold ($\mu$m) of not more than 5 is so high in connection reliability in the wire bonding that the connection with the semiconductor devices can be ensured. Thus, the flexible wiring board thus formed can minimize the yielding of defective products and also can be used as the electronic components of high reliability.

Thus, the flexible wiring board having the gold pad having both the dynamic Vickers hardness of not less than 50 and the ratio of amount of nickel (atomic weight %) in the surface of the gold pad to thickness of gold ($\mu$m) of not more than 5 is even higher in connection reliability in the wire bonding, so that it can be used as the electronic component of rather high reliability.

No particular limitations are imposed on the bonding wires connected with the gold pads of the flexible wiring board of the present invention and known bonding wires, such as a gold streak wire and an aluminum streak wire, may be used. Also, either of the ball bonding and the wedge bonding may be used for the connection of the bonding wires to the gold pads. Further, known bonding tools may be used, including a thermal bonding tool, an ultrasonic bonding tool, and a thermal-and-ultrasonic bonding tool.

The flexible wiring board of the present invention is not limited to the one placing the semiconductor devices thereon but may be designed, for example, to achieve the connection with the semiconductor devices placed on another member by the wire bonding. Further, in so far as the connection is achieved by the wire bonding, the use of semiconductor devices are not of exclusive.

Additionally, the gold pad may be formed by various known processes, without limiting to the plating.

Examples

In the following, the present invention will be described in detail with reference to some examples of the present invention and comparative examples, which are for purposes of illustration only and the present invention is not to be limited thereto.

(1) Production of flexible wiring board

Various flexible wiring boards were produced by combining the following compositions and conditions.

Gold pad: A gold plating layer and a nickel plating layer having the thickness of the following ranges were formed by the plating shown below.

(1) Plating: Ni-Au Electroplating, Ni-Au Electroless plating;
(2) Thickness of gold: 0.08–1.1 $\mu$m; and
(3) Thickness of nickel: 0.7–10.5 $\mu$m.

Conductor layer: Copper foils of the types and thickness shown below were used.

(1) Types of copper foil: Rolled copper foil, electrolytic copper foil, and electrolytic copper foil of microscopic crystals; and
(2) Thickness of copper foil: 35 $\mu$m, 18 $\mu$m.

Adhesive layer: Either of the two types of adhesives shown below was used to form the adhesive layer having a thickness of 15 $\mu$m between the cover layer and the conductor layer, the adhesive layer having a thickness of 15 $\mu$m between the conductor layer and the base layer and the adhesive layer having a thickness of 25 $\mu$m between the base layer and the reinforcing layer, as needed.

(1) Epoxy-acrylic rubber adhesive (L): Complex shear modulus (G*) at 25 Hz is of $8.4 \times 10^9$ dyn/cm$^2$ at 25° C. and $3.5 \times 10^9$ dyn/cm$^2$ at 100° C.; and
(2) Epoxy-nitrile-butyl rubber adhesive (T): Complex shear modulus (G*) at 25 Hz is of $7.3 \times 10^9$ dyn/cm$^2$ at 25° C. and $1.6 \times 10^9$ dyn/cm$^2$ at 100° C.

Base layer: Polyimide having a thickness of 25 $\mu$m was used.

Cover layer: Polyimide having a thickness of 25 $\mu$m was used.

Reinforcing layer: The following types having a thickness of 1 mm were used.

(1) Aluminum board; and
(2) Glass-epoxy resin board.

Surfaces of the gold pads of some of the flexible wiring boards obtained by combination of the composition above were washed by the sulfuric acid washing or the argon-plasma washing.

Of the flexible wiring boards thus produced, some typical ones are shown as Examples and Comparative examples in TABLES 1–6 shown below.

TABLE 1

| Example | | | 1 | 2 | 3 | 4 |
|---|---|---|---|---|---|---|
| Composition of Flexible Wiring Board | Gold pad | Plating | Electroplating | → | → | → |
| | | Thickness of Gold ($\mu$m) | 0.53 | 0.51 | 0.51 | 0.51 |
| | | Thickness of nickel ($\mu$m) | 10.4 | 5.1 | 5.1 | 5.2 |
| | Copper foil | Type | Rolled | → | → | → |
| | | Thickness ($\mu$m) | 18 | → | → | → |
| | Copper foil/base layer adhesive | Type | None | → | → | → |
| | | Thickness ($\mu$m) | — | — | — | — |
| | Base layer | Type | Polyimide | → | → | → |
| | | Thickness ($\mu$m) | 25 | → | → | → |
| | Base layer/reinforcing layer adhesive | Type | L | → | → | T |
| | | Thickness ($\mu$m) | 25 | → | → | → |
| | Reinforcing layer | Type | Aluminum | → | → | → |
| | | Thickness (mm) | 1 | → | → | → |
| Wire bonding temperature (° C.) | | | 25 | → | 100 | 25 |
| Dynamic Vickers hardness of Gold pad | | | 72 | 55 | 51 | 53 |
| Success rate of wire bonding (%) | | | 100 | 100 | 100 | 100 |

TABLE 2

| Example | | | 5 | 6 | 7 | 8 |
|---|---|---|---|---|---|---|
| Composition of Flexible Wiring Board | Gold pad | Plating | Electroplating | → | → | → |
| | | Thickness of Gold ($\mu$m) | 0.52 | 0.55 | 0.50 | 0.52 |
| | | Thickness of nickel ($\mu$m) | 5.0 | 5.3 | 5.3 | 5.2 |
| | Copper foil | Type | Rolled | Electrolytic | Electrolytic Microscopic crystal | Rolled |
| | | Thickness ($\mu$m) | 35 | 18 | → | → |
| | Copper foil/base layer adhesive | Type | None | → | → | → |
| | | Thickness ($\mu$m) | — | — | — | — |
| | Base layer | Type | Polyimide | → | → | → |
| | | Thickness ($\mu$m) | 25 | → | → | → |
| | Base layer/reinforcing layer adhesive | Type | L | → | → | → |
| | | Thickness ($\mu$m) | 25 | → | → | → |
| | Reinforcing layer | Type | Aluminum | → | → | Glass-epoxy resin |
| | | Thickness (mm) | 1 | → | → | → |
| Wire bonding temperature (° C.) | | | 25 | → | → | → |
| Dynamic Vickers hardness of Gold pad | | | 55 | 54 | 65 | 55 |
| Success rate of wire bonding (%) | | | 100 | 100 | 100 | 100 |

TABLE 3

| | Example | | 9 | 10 | 11 | 12 | 13 |
|---|---|---|---|---|---|---|---|
| Composition of Flexible Wiring Board | Gold pad | Plating | Electro plating | → | → | → | → |
| | | Thickness of Gold (μm) | 0.56 | 0.84 | 1.0 | 0.14 | 0.14 |
| | | Thickness of nickel (μm) | 5.3 | 5.1 | 5.2 | 5.2 | 5.2 |
| | Copper foil | Type | Rolled | → | → | → | → |
| | | Thickness (μm) | 35 | → | → | → | → |
| | Copper foil/base layer adhesive | Type | None | → | → | → | → |
| | | Thickness (μm) | — | — | — | — | — |
| | Base layer | Type | Polyimide | → | → | → | → |
| | | Thickness (μm) | 25 | → | → | → | → |
| | Base layer/reinforcing layer adhesive | Type | L | → | → | → | → |
| | | Thickness (μm) | 25 | → | → | → | → |
| | Reinforcing layer | Type | Aluminum | → | → | → | → |
| | | Thickness (mm) | 1 | → | → | → | → |
| Amount of nickel in surface of gold pad (Atomic weight %) | | | 0.9 | 0.1 | 0 | 0.3 | 0.3 |
| Amount of nickel in surface of gold pad/thickness of gold (Atomic weight %/μm) | | | 1.6 | 0.1 | 0 | 2.1 | 2.1 |
| Success rate of wire bonding (%) | | | 100 | 100 | 100 | 100 | 100 |

TABLE 4

| | Example | | 14 | 15 | 16 | 17 | 18 |
|---|---|---|---|---|---|---|---|
| Composition of Flexible Wiring Board | Gold pad | Plating | Electro plating | → | → | Electro plating | → |
| | | Thickness of Gold (μm) | 0.58 | 0.80 | 1.06 | 0.51 | 0.50 |
| | | Thickness of nickel (μm) | 5.0 | 5.1 | 5.3 | 5.2 | 5.1 |
| | Copper foil | Type | Rolled | → | → | → | → |
| | | Thickness (μm) | 35 | → | → | → | 18 |
| | Copper foil/base layer adhesive | Type | None | → | → | L | None |
| | | Thickness (μm) | — | — | — | 15 | — |
| | Base layer | Type | Polyimide | → | → | → | → |
| | | Thickness (μm) | 25 | → | → | → | → |
| | Base layer/reinforcing layer adhesive | Type | L | → | → | → | → |
| | | Thickness (μm) | 25 | → | → | → | → |
| | Reinforcing layer | Type | Aluminum | → | → | → | → |
| | | Thickness (mm) | 1 | → | → | → | → |
| Amount of nickel in surface of gold pad (Atomic weight %) | | | 1.5 | 0.2 | 0.1 | 0.9 | 0.8 |
| Amount of nickel in surface of gold pad/thickness of gold (Atomic weight %/μm) | | | 2.6 | 0.3 | 0.1 | 1.8 | 1.6 |
| Success rate of wire bonding (%) | | | 100 | 100 | 100 | 100 | 100 |

TABLE 5

| Comparative Example | | | 1 | 2 | 3 | 4 |
|---|---|---|---|---|---|---|
| Composition of Flexible Wiring Board | Gold pad | Plating | Electro plating | → | → | → |
| | | Thickness of Gold (μm) | 0.52 | 0.53 | 0.51 | 0.53 |
| | | Thickness of nickel (μm) | 0.7 | 2.4 | 5.2 | 3.1 |
| | Copper foil | Type | Rolled | → | → | → |
| | | Thickness (μm) | 18 | | | 35 |
| | Copper foil/base layer adhesive | Type | None | → | → | L |
| | | Thickness (μm) | — | — | — | 15 |
| | Base layer | Type | Polyimide | → | → | → |
| | | Thickness (μm) | 25 | → | → | → |
| | Base layer/rein- forcing layer adhesive | Type | L | → | T | L |
| | | Thickness (μm) | 25 | → | → | → |
| | Reinforc- ing layer | Type | Aluminum | → | → | → |
| | | Thickness (mm) | 1 | → | → | → |
| Wire bonding temperature (° C.) | | | 25 | → | 100 | 25 |
| Dynamic Vickers hardness of Gold pad | | | 30 | 33 | 37 | 44 |
| Success rate of wire bonding (%) | | | 65 | 78 | 69 | 95 |

The dynamic Vickers hardness of the gold pads of the various flexible wiring boards thus produced were measured with the dynamic Vickers hardness test equipment (available from Shimazu Corporation, Model No. DUH-201: Test load of 50 gf). This measurement was made at a temperature corresponding to the temperature at which the wire bonding was made. In principle, the measurement was made at room temperature, but the dynamic Vickers hardness of the gold pads produced in the wire bonding at e.g. 100° C. was measured at 100° C. In TABLES 1, 2 and 5 the dynamic Vickers hardness of the Examples and Comparative examples are shown.

(3) Measurement of the amount of nickel in a surface of the gold pad (atomic weight %) and calculation of a ratio of amount of nickel (atomic weight %) in a surface of the gold pad to thickness of gold (μm)

The amount of nickel in the surface of the gold pad (atomic weight %) was measured with the X-ray photoelectron spectroscopy (ESCA) and the measured value was divided by the thickness of gold (μm) to calculate the ratio of the amount of nickel (atomic weight %) in the surface of the gold pad to thickness of gold (μm). In TABLES 3, 4 and 6, the ratio of the amount of nickel (atomic weight %) in the surface of the gold pad to the thickness of gold (μm) of each of Examples and Comparative examples are shown.

(4) Evaluation of the Connection Reliability in the Wire Bonding

Under the following conditions, the wire bonding was given to each of the gold pads of the various flexible wiring boards thus produced.

TABLE 6

| Comparative Example | | | 5 | 6 | 7 | 8 | 9 | 10 |
|---|---|---|---|---|---|---|---|---|
| Composition of Flexible Wiring Board | Gold pad | Plating | Electro plating | → | Electro less plating | → | Electro plating | → |
| | | Thickness of Gold (μm) | 0.14 | 0.27 | 0.14 | 0.35 | 0.22 | 0.12 |
| | | Thickness of nickel (μm) | 5.2 | 5.0 | 5.1 | 5.5 | 5.1 | 5.0 |
| | Copper foil | Type | Rolled | → | → | → | → | → |
| | | Thickness (μm) | 35 | → | → | → | 35 | 18 |
| | Copper foil/base layer adhesive | Type | None | → | → | → | L | None |
| | | Thickness (μm) | — | — | — | — | 15 | — |
| | Base layer | Type | Polyimide | → | → | → | → | → |
| | | Thickness (μm) | 25 | → | → | → | → | → |
| | Base layer/rein- forcing layer adhesive | Type | L | → | → | → | → | → |
| | | Thickness (μm) | 25 | → | → | → | → | → |
| | Reinforc- ing layer | Type | Aluminum | → | → | → | → | → |
| | | Thickness (mm) | 1 | → | → | → | → | → |
| Amount of nickel in surface of gold pad (Atomic weight %) | | | 2.9 | 1.8 | 4.8 | 2.3 | 1.9 | 3 |
| Amount of nickel in surface of gold pad/thickness of gold (Atomic weight %/μm) | | | 20.7 | 6.7 | 34.3 | 6.6 | 8.6 | 25 |
| Success rate of wire bonding (%) | | | 58 | 87 | 72 | 90 | 92 | 62 |

(2) Measurement of Dynamic Vickers Hardness of Gold Pads

Gold streak wire: Model No. TGBW30-SR available from Tanaka Denshi Kogyo K. K. having four nines (99.99%) in purity and diameter of 30 μm.

Wire bonding equipment: A manual bonder (Model No. MB-2200) available from Nippon Avionics Co., Ltd.

Capillary: Ceramic type (Model No. 1513-18M-437GM) available from GAISER

Wire bonding conditions:

|  | First bonding part (Ball) | Second bonding part (Wedge) |
|---|---|---|
| Pressure (kgf) | 75 | 125 |
| Output of ultrasonic wave (mW) | 50 | 200 |
| Bonding time (ms) | 100 | 100 |

Success rate of the wire bonding: After the wire bonding was carried out under the conditions above, the wire pull test was carried out. The breakage strength of wire of less than 5 gf was expressed as "rejectable quality" and the breakage strength of wire of not less than 5 gf was expressed as "acceptable quality". The rate of the number of the wire of "acceptable quality" was expressed as a success rate of the wire bonding and was considered as a reference index on the connection reliability in the wire bonding.

Figure 2:
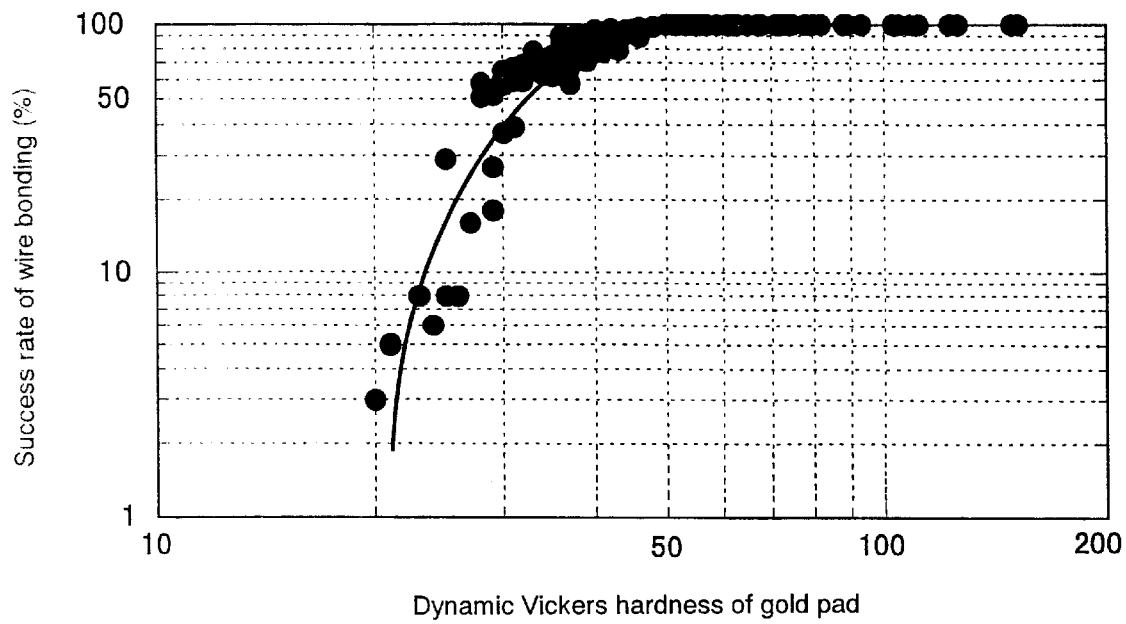
FIG. 2 is a correlation diagram showing a relationship between dynamic Vickers hardness of the gold pad and a success rate of a wire bonding.
Figure 3:
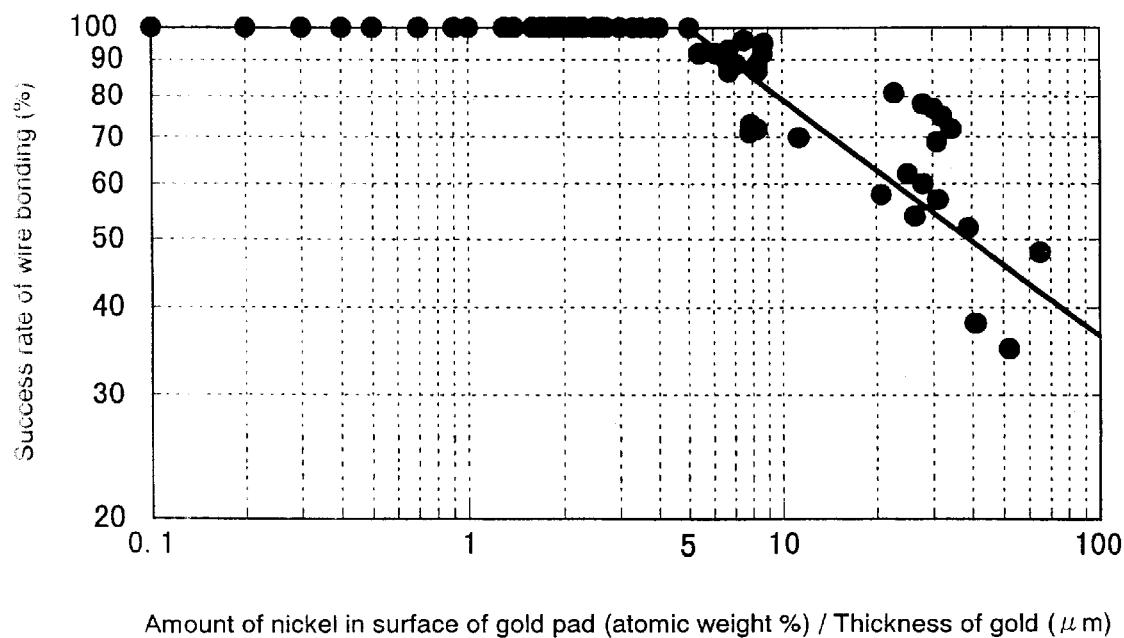
FIG. 3 is a correlation diagram showing a relationship between a ratio of amount of nickel (atomic weight %) in a surface of the gold pad to thickness of gold ($\mu$m) and a success rate of the wire bonding.

The relationship between the dynamic Vickers hardness of the gold pad and the success rate of the wire bonding is shown in FIG. 2 and the relationship between the ratio of the amount of nickel (atomic weight %) in the surface of the gold pad to the thickness of gold ($\mu$m) and the success rate of the wire bonding is shown in TABLES 1–6.

Also, the success rate of the wire bonding of each of Examples and Comparative examples is shown in FIGS. 1–6.

As seen from FIG. 2, when the dynamic Vickers hardness of the gold pad is not less than 50, the success rate of the wire bonding is 100%. Also, as seen from FIG. 3, when the ratio of the amount of nickel (atomic weight %) in the surface of the gold pad to the thickness of gold ($\mu$m) is not more than 5, the success rate of the wire bonding is 100%.

While the illustrative examples of the present invention are provided in the above description, such is for illustrative purpose only and it is not to be construed restrictively. Modification and variation of the present invention that will be obvious to those skilled in the art is to be covered in the following claims.

What is claimed is:

1. A flexible wiring board including a base layer, a conductor layer provided on the base layer and a gold pad having a dynamic Vickers hardness of not less than 50 provided on the conductor layer, said gold pad comprising a gold layer provided on a nickel layer, the nickel layer having a thickness of 4–15 $\mu$m; and said base layer being reinforced with a reinforcing layer at an area corresponding to a position of the gold pad, an adhesive layer being interposed between the base layer and the reinforcing layer, said adhesive layer having a complex shear modulus (G*) of not less than $2.0 \times 10^9$ dyn/cm$^2$ at 25 Hz at a temperature at which the gold pad is connected with wires by wire bonding.

2. A flexible wiring board including a gold pad comprising a gold layer provided on a nickel layer and having a ratio of an amount of nickel (atomic weight %) in a surface of the gold layer of the gold pad to thickness of the gold layer ($\mu$m) of not more than 5.

3. The flexible wiring board of claim 2, where the nickel layer has a thickness of 4–15 $\mu$m.

4. The flexible wiring board of claim 2, where the gold layer has a thickness of 0.3–5 $\mu$m.

5. A flexible wiring board including a gold pad comprising a gold layer provided on a nickel layer and having a dynamic Vickers hardness of not less than 50 and a ratio of an amount of nickel (atomic weight %) in a surface of the cold layer of the gold pad to thickness of the gold layer ($\mu$m) of not more than 5.

6. The flexible wiring board of claim 5, where the nickel layer has a thickness of 4–15 $\mu$m.

7. The flexible wiring board of claim 5, where the gold layer has a thickness of 0.3–5 $\mu$m.

* * * * *

UNITED STATES PATENT AND TRADEMARK OFFICE
CERTIFICATE OF CORRECTION

PATENT NO. : 6,280,828 B1
DATED : August 28, 2001
INVENTOR(S) : Yasuo Nakatsuka et al.

It is certified that error appears in the above-identified patent and that said Letters Patent is hereby corrected as shown below:

Column 14,
Line 33, "the cold layer" should be -- the gold layer --.

Signed and Sealed this

Twelfth Day of March, 2002

Attest:

JAMES E. ROGAN
Attesting Officer    Director of the United States Patent and Trademark Office